United States Patent [19]

Kakiuchi et al.

[11] Patent Number: 5,210,597
[45] Date of Patent: May 11, 1993

[54] NON-VOLATILE SEMICONDUCTOR MEMORY DEVICE AND A METHOD FOR FABRICATING THE SAME

[75] Inventors: Takao Kakiuchi; Kazuo Sato, both of Takatsuki, Japan

[73] Assignee: Matsushita Electronics Corporation, Osaka, Japan

[21] Appl. No.: 664,207

[22] Filed: Mar. 4, 1991

[30] Foreign Application Priority Data

Mar. 8, 1990 [JP] Japan .................................. 2-57192

[51] Int. Cl.$^5$ ...................... H01L 29/68; H01L 29/34; G11C 11/34
[52] U.S. Cl. ...................... 257/321; 357/54; 365/185
[58] Field of Search ............ 357/23.5, 54, 55; 365/185

[56] References Cited

U.S. PATENT DOCUMENTS

| | | | |
|---|---|---|---|
| 4,951,103 | 8/1989 | Esquivel et al. | 357/23.5 |
| 4,982,377 | 1/1991 | Iwasa | 357/23.5 |
| 5,017,979 | 5/1991 | Fujii et al. | 357/23.5 |

FOREIGN PATENT DOCUMENTS

1207978 8/1989 Japan .

OTHER PUBLICATIONS

G. Yaron et al. "1982 Digest of Technical Papers" ISSCC 82, pp. 108-109 Nonvolatile Memories.

Primary Examiner—Mark V. Prenty
Attorney, Agent, or Firm—Ratner & Prestia

[57] ABSTRACT

A long-life, electrically writable and erasable non-volatile semiconductor memory device is disclosed. The memory device is fabricated in the following steps. After forming a first gate insulating film on a semiconductor substrate, a window is opened in the first gate insulating film to expose a portion of the surface of the semiconductor substrate, using a two-step etching technique in which dry etching and wet etching are performed successively. The exposed portion of the semiconductor substrate not over-etched is selectively oxidized to form a tunnel insulating film (second gate insulating film) having edge portions resistant to dielectric breakdown. Thereafter, a floating gate, a third gate insulating film, and a control gate are formed sequentially. The floating gate is patterned in such a way as to cover the entire tunnel insulating film or cross only a portion of an edge of the tunnel insulating film. The stress caused to the tunnel insulating film as a result of the oxidation process for forming the third gate insulating film is relieved, providing the tunnel insulating film with resistance to dielectric strength.

4 Claims, 18 Drawing Sheets

NON-VOLATILE SEMICONDUCTOR MEMORY DEVICE AND A METHOD FOR FABRICATING THE SAME

BACKGROUND OF THE INVENTION

1. Field of the Invention

The present invention relates to a non-volatile semiconductor memory device, and more particularly to a non-volatile semiconductor memory device which information can be electrically written to and erased from. And the invention relates to a method for fabricating the same.

2. Description of the Prior Art

FIG. 8C shows a cross section of a portion of a prior art non-volatile semiconductor memory device (EEPROM: electrically erasable programmable read only memory) which information can be electrically written to and erased from. Such an EEPROM is disclosed, for example, on page 108 in ISSCC, 1982 by Giora Yavon et al.

Referring to FIGS. 8A to 8C, we will describe a prior art method for the fabrication of a non-volatile semiconductor memory device. First, as shown in FIG. 8A, a source region 102a and a drain region 102b, each formed by a diffusion layer, are formed in a silicon substrate 101, and then a first gate insulating film 103 is formed on the silicon substrate 101. The formation of the diffusion layers is achieved by implantation of impurity ions. Ions of opposite conductivity type to that of the silicon substrate 101 are used as the impurity ions. After that, a photoresist (not shown) is applied over the first gate insulating film 103. The photoresist has a window region that defines the plane pattern of a window 109 to be opened in the first gate insulating film 103.

Using the photoresist as an etching mask, dry etching is performed to etch the first gate insulation film 103, thereby opening the window 109 in the first gate insulating film 103 to expose a surface region 107 of the silicon substrate 101. The window 109 is formed above the drain region 102b. As a result of the dry etching, the surface region 107 of the silicon substrate 101 is over-etched and a recess is formed on the surface region 107. The height of the recess is approximately 5 nm to 10 nm. When wet etching is used instead of the dry etching, formation of a recess resulting from over-etching will not occur. However, when a cleaning process using NH4OH or other ammoniacal solution is performed after that, the surface region 107 is etched and a recess is formed on the surface region 107.

Next, as shown in FIG. 8B, a second gate insulating film 110 is formed on the drain region 102b by selectively oxidizing the exposed surface region 107. After that, as shown in FIG. 8C, a floating gate 111 is formed on the first gate insulating film 103, after which a third gate insulating film 113 is formed over the floating gate 111 by oxidizing the surface of the floating gate 111, while a control gate 114 is formed above the floating gate 111, thus completing the fabrication of a non-volatile semiconductor memory device.

FIG. 8D shows a cross section of the second gate insulating film 110 of the non-volatile semiconductor memory device thus fabricated. As shown in FIG. 8D, since a recessed portion is formed on the surface region 107 because of over-etching, the edge portion of the second gate insulating film 110 is bent and has a reduced thickness. FIG. 8E is a plan view showing the layout of the second gate insulating film 110 and the floating gate 111 in the non-volatile semiconductor memory device.

Thus, according to the prior art method, a recess is formed on the surface of the silicon substrate 101 during the processing step of opening the window 109 in the first gate insulating film 103. Since the edge portion of the second gate insulating film 110 is bent because of the thus formed recess, electric fields concentrate in the edge portion of the second gate insulating film 110 during operation, making the second gate insulating film 110 prone to dielectric breakdown. Furthermore, the reduced thickness of the edge portion of the second gate insulating film 110 results in a decreased dielectric strength. Therefore, the prior art non-volatile semiconductor memory device has the disadvantage that when writing and erasing operations are repeated, the second gate insulating film 1 10 suffers breakdown in a relatively short time, which means that the life time of the memory device is short.

SUMMARY OF THE INVENTION

The non-volatile semiconductor memory device of this invention, which overcomes the above-discussed and numerous other disadvantages and deficiencies of the prior art, comprises: a semiconductor substrate having a source region and a drain region each formed by a diffusion layer; a first gate insulating film formed on said semiconductor substrate, said first gate insulating film having a window; a second gate insulating film formed on said semiconductor substrate within said window; a floating gate formed on said first gate insulating film, said floating gate covering a portion of said second gate insulating film; a third gate insulating film formed on said floating gate; and a control gate formed on said third gate insulating film, wherein said floating gate has a first portion positioned on said first gate insulating film, a second portion positioned on said second gate insulating film, and a third portion interconnecting said first and second portions, said second portion being positioned within said window, the length of said third portion along the channel width direction being shorter than that of said second portion.

In a preferred embodiment, said source region is formed outside of the region where said floating gate is formed; and a portion of said control gate covers a portion of said semiconductor substrate surface with said third gate insulating film interposed therebetween at a region between said floating gate and said source region.

According to the invention a non-volatile semiconductor memory device is provided, comprising: a semiconductor substrate having a source region and a drain region each formed by a diffusion layer; a first gate insulating film formed on said semiconductor substrate, said first gate insulating film having a window; a second gate insulating film formed on said semiconductor substrate within said window; a floating gate formed on said first gate insulating film, said floating gate covering fully said second gate insulating film; a third gate insulating film formed on said floating gate; and a control gate formed on said third gate insulating film.

In a preferred embodiment, said source region is formed outside of the region where said floating gate is formed; and a portion of said control gate covers a portion of said semiconductor substrate surface with said third gate insulating film interposed therebetween at a region between said floating gate and said source region.

According to the invention, a non-volatile semiconductor memory device is provided, comprising: a semiconductor substrate having a source region and a drain region each formed by a diffusion layer; a first gate insulating film formed on said semiconductor substrate, said first gate insulating film having a window; a second gate insulating film formed on said semiconductor substrate within said window; a floating gate formed on said first gate insulating film, said floating gate covering a portion of said second gate insulating film; a third gate insulating film formed on said floating gate; and a control gate formed on said third gate insulating film, wherein said source region is formed outside of the region where said floating gate is formed, and a portion of said control gate covers a portion of said semiconductor substrate surface with said third gate insulating film interposed therebetween at a region between said floating gate and said source region.

According to the invention, a method for fabricating a non-volatile semiconductor memory device is provided, comprising the steps of: forming a first gate insulating film on a semiconductor substrate; opening a window in said first gate insulating film to expose a portion of the surface of said semiconductor substrate; forming a second gate insulating film that acts as a tunnel insulating film on the exposed portion of said semiconductor substrate; forming a floating gate on said first gate insulating film and said second gate insulating film; forming a third gate insulating film on said floating gate; and forming a control gate on said third gate insulating film, said step of opening said window comprising the steps of: forming an etching mask defining the pattern of said window on said first gate insulating film; performing a first etching process to reduce the thickness of said first gate insulating film at the portion not covered with said etching mask; performing a second etching process to remove said reduced portion of said first gate insulating film; and removing said etching mask.

In a preferred embodiment, said method further comprises the step of: forming a source region and a drain region in said semiconductor substrate before the step of forming said first gate insulating film on said semiconductor substrate, said window being formed above said drain region.

In a preferred embodiment, said method further comprises the step of: performing ion implantation using said floating gate as a mask, to implant impurity ions into said semiconductor substrate and form a source region and a drain region in said semiconductor substrate in self-aligning fashion with respect to said floating gate, after the step of forming said floating gate.

In a preferred embodiment, said method further comprises the steps of: performing ion implantation using said floating gate and a resist as a mask, to implant impurity ions into said semiconductor substrate and form a drain region in said semiconductor substrate in self-aligning fashion with respect to said floating gate, after the step of forming said floating gate; and performing ion implantation using said control gate as a mask, to implant impurity ions into said semiconductor substrate and form a source region in said semiconductor substrate in self-aligning fashion with respect to said control gate, after the step of forming said control gate.

In a preferred embodiment, said first etching process is dry etching, and said second etching process is wet etching.

In a preferred embodiment, a cleaning step is performed using sulfuric acid after said step of opening said window and before said step of forming said second gate insulating film.

In a preferred embodiment, a cleaning step is performed using a mixture of sulfuric acid and hydrogen peroxide after said step of opening said window and before said step of forming said second gate insulating film.

In a preferred embodiment, said floating gate is formed to cover fully said second gate insulating film.

According to the invention, a method of fabricating a non-volatile semiconductor memory device is provided, comprising the steps of: forming a first gate insulating film on a semiconductor substrate; opening a window in said first gate insulating film to expose a portion of the surface of said semiconductor substrate; forming a second gate insulating film that acts as a tunnel insulating film on the exposed portion of said semiconductor substrate; forming a floating gate on said first gate insulating film and said second gate insulating film; forming a third gate insulating film on said floating gate; and forming a control gate on said third gate insulating film, wherein: the exposed portion of said semiconductor substrate constitutes a recessed portion on the surface of said semiconductor substrate; and the plane pattern of said window is controlled so that the side walls of said recessed portion have planes more susceptible to oxidation than that of the bottom of said recessed portion.

In a preferred embodiment, said semiconductor substrate is a single-crystalline semiconductor substrate having a (100) plane as its main surface; said window has a rectangular plane pattern formed by four sides parallel to the <110> orientation of said single-crystalline semiconductor substrate; and said step of forming said second gate insulating film comprises a step of forming an oxide film by selectively oxidizing the exposed portion of said semiconductor substrate.

In a preferred embodiment, the oxidation in said step of forming said second gate insulating film is performed by an RTA method.

In a preferred embodiment, said step of forming said second gate insulating film further comprises the steps of: forming an oxide film on said exposed portion of said semiconductor substrate; and forming a nitride film on said oxide film.

According to the invention, a method of fabricating a non-volatile semiconductor memory device is provided, comprising the steps of: forming a first gate insulating film on a semiconductor substrate; opening a window in said first gate insulating film to expose a portion of the surface of said semiconductor substrate; forming a second gate insulating film that acts as a tunnel insulating film on the exposed portion of said semiconductor substrate; forming a floating gate on said first gate insulating film and said second gate insulating film; forming a third gate insulating film on said floating gate; and forming a control gate on said third gate insulating film, said method further comprising the steps of: implanting impurity ions of opposite conductivity type to that of said semiconductor substrate into said semiconductor substrate through said window, after said step of opening said window in said first gate insulating film; and performing annealing to recover the damage layer formed in said semiconductor substrate as a result of implantation of the impurity ions, before said step of forming said second gate insulating film.

In a preferred embodiment, said method further comprises the step of: performing ion implantation using said floating gate as a mask to implant impurity ions into said semiconductor substrate and form a source region and a drain region in said semiconductor substrate in self-aligning fashion with respect to said floating gate, after said step of forming said floating gate.

In a preferred embodiment, said method further comprises the steps of: performing ion implantation using said floating gate as a mask to implant impurity ions into said semiconductor substrate and form a drain region in said semiconductor substrate in self-aligning fashion with respect to said floating gate, after said step of forming said floating gate; and performing ion implantation using said control gate as a mask to implant impurity ions into said semiconductor substrate and form a source region in said semiconductor substrate in self-aligning fashion with respect to said control gate, after said step of forming said control gate.

According to invention, a method of fabricating a non-volatile semiconductor memory device is provided, comprising the steps of: forming a first gate insulating film on a semiconductor substrate; opening a window in said first gate insulating film to expose a portion of the surface of said semiconductor substrate; forming a second gate insulating film that acts as a tunnel insulating film on the exposed portion of said semiconductor substrate; forming a floating gate on said first gate insulating film and said second gate insulating film; forming a third gate insulating film on said floating gate; and forming a control gate on said third gate insulating film, said method further comprising the steps of: performing ion implantation using said floating gate as a mask to implant impurity ions into said semiconductor substrate and form a drain region in said semiconductor substrate in self-aligning fashion with respect to said floating gate, after said step of forming said floating gate; and performing ion implantation using said control gate as a mask to implant impurity ions into said semiconductor substrate and form a source region in said semiconductor substrate in self-aligning fashion with respect to said control gate, after said step of forming said control gate.

Thus, the present invention described herein makes possible the objectives of: (1) providing a long-life non-volatile semiconductor memory device having a second gate insulating film resistant to dielectric breakdown; and (2) providing a method for fabricating a non-volatile semiconductor memory device, which makes it possible to form a second gate insulating film resistant to dielectric breakdown.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1A:
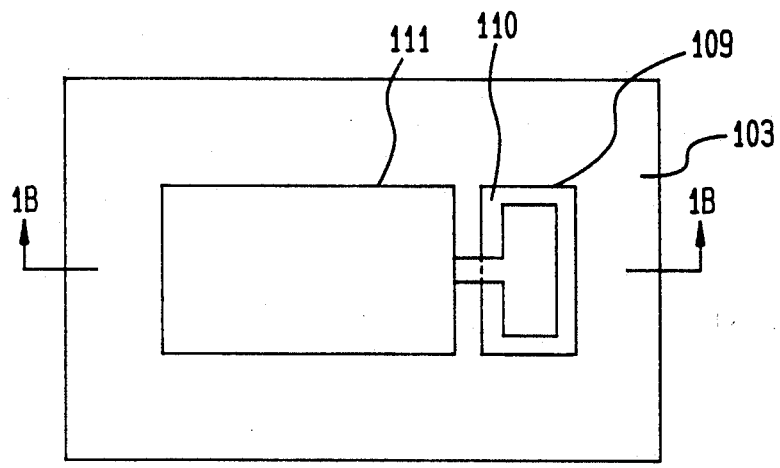
FIG. 1A is a plan view of a non-volatile semiconductor memory device according to the present invention.
Figure 1B:
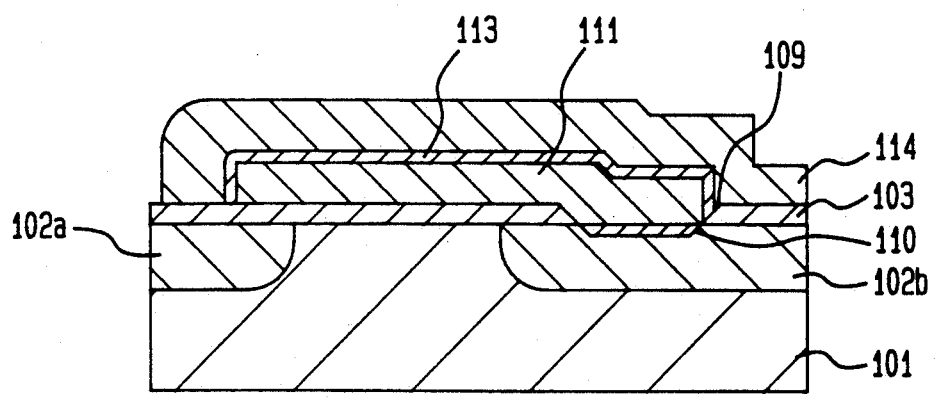
FIG. 1B is a cross sectional view taken along line A—A in FIG. 1A.

FIG. 1A shows a plan view of a non-volatile semiconductor memory device (EEPROM) according to this embodiment of the invention. FIG. 1B is a cross sectional view taken along line A—A in FIG. 1A. In practice, the non-volatile semiconductor memory device as shown in FIGS. 1A and 1B is integrated in numerous numbers on the same silicon substrate (silicon chip), but in the following description, we will only deal with a single device for the purpose of simplicity. Numerous devices integrated on the same silicon substrate are electrically isolated from each other by conventional field oxides (such as LOCOS).

As shown in FIG. 1B, the non-volatile semiconductor memory device comprises: a silicon substrate 101 having a source region 102a and a drain region 102b each formed by a diffusion layer; a first gate insulating film 103 formed on the silicon substrate 101 and having a window 109; a second gate insulating film 110 formed on the silicon substrate 101 within the window 109; a floating gate 111 formed on the first gate insulating film 103 and covering a portion of the second gate insulating film 110; a third gate insulating film 113 formed on the floating gate 111; and a control gate 114 formed on the third gate insulating film 113. The second gate insulating film 110 formed on the drain region 102b within the window 109 acts as a tunnel insulating film. When a voltage (erasure voltage) exceeding a certain level is applied between the drain region 102b and the control gate 114, carriers in the drain region 102b are caused to tunnel through the second gate insulating film 110 and injected into the floating gate 111 and held in it. On the other hand, when a voltage (writing voltage) exceeding a certain level is applied between the drain region 102b and the control gate 114, carriers in the floating gate 111 are caused to tunnel through the second gate insulating film 110 and injected into the drain region 102b. The direction of the electric field formed in the second gate insulating film 110 during writing is reversed from that of the electric field formed therein during erasure. The presence or absence of the carriers (charges) in the floating gate 111 determines the threshold voltage at the control gate 114 (measured with respect to source voltage) to form an inversion layer in the channel region between the source region 102a and the drain region 102b. Thus, the information is written and stored in the non-volatile semiconductor memory device in the form of a change in the threshold voltage.

As shown in FIG. 1A, the floating gate 111 of this embodiment covers a portion of the second gate insulating film 110. FIG. 2H is an enlarged plan view showing the positional relationship (plane layout) between the floating gate 111 and the window 109. As shown in FIG. 1A and FIG. 2H, the floating gate 111 has a first portion positioned on the first gate insulating film 103 and not directly contacting the second gate insulating film 110, and a second portion positioned in the window 109 and contacting the second gate insulating film 110. These two portions are interconnected by a third portion formed across one of the four sides of the rectangular window 109 (across an edge of the second gate insulating film 110). The length L3 of the third portion of the floating gate 111 (the length along the channel width direction) is shorter than the length L2 of the second portion. Also, the second portion has a smaller area than the second gate insulating film 110 and is positioned within the window 109.

Figure 8A:
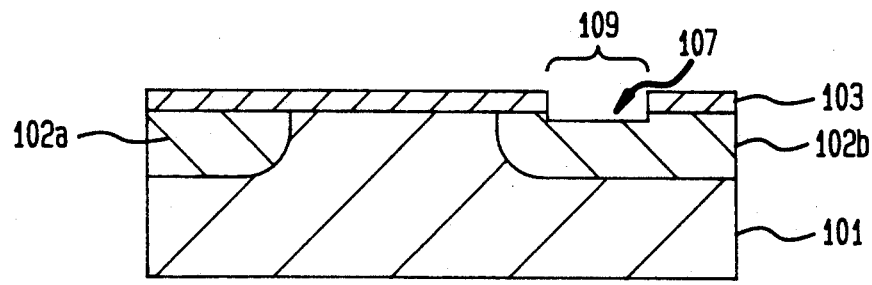
FIGS. 8A to 8E show a non-volatile semiconductor memory device in various processing steps according to a prior art method for the fabrication of the memory device.
Figure 8B:
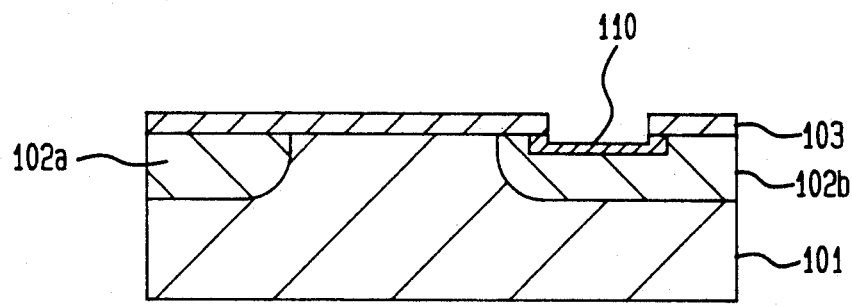
Figure 8C:
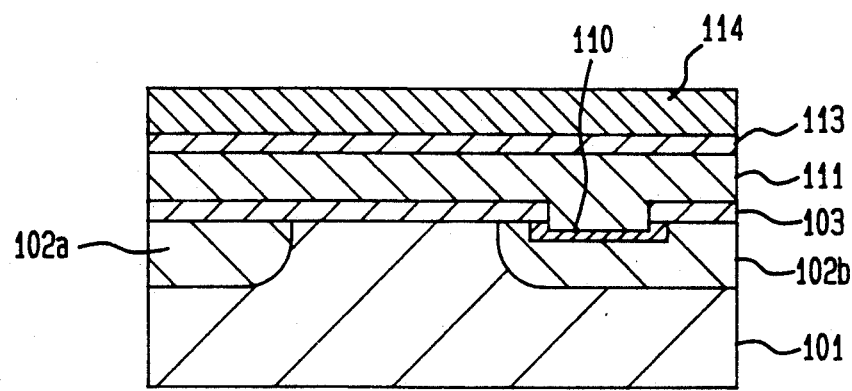
Figure 8D:
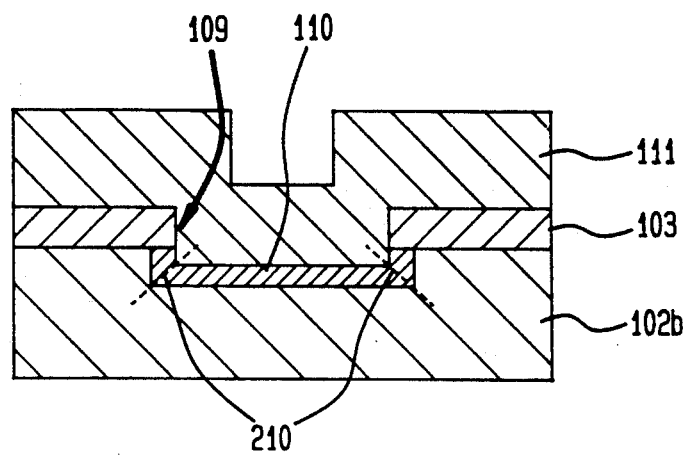
Figure 8E:
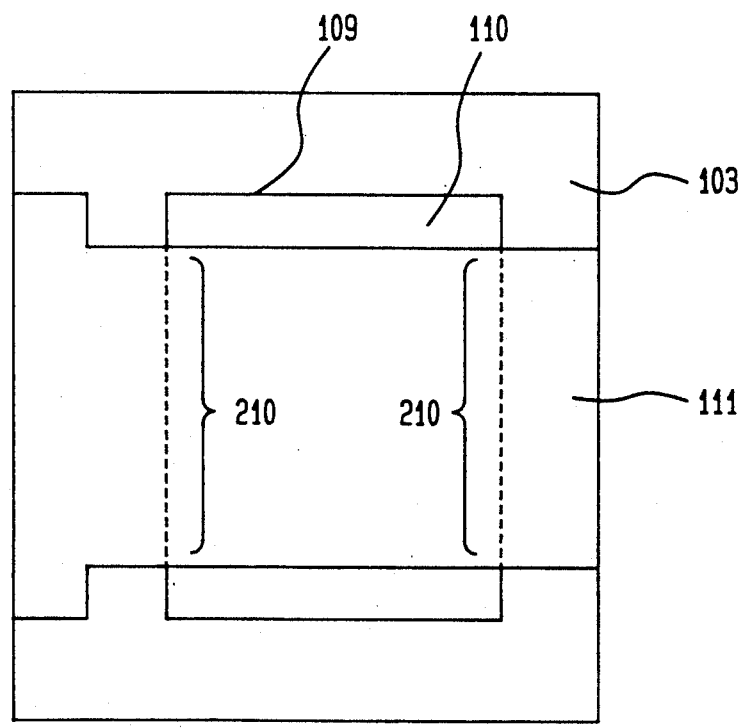

On the other hand, the floating gate 111 of the prior art non-volatile semiconductor memory device has a plane pattern as shown in FIG. 8E. According to an experiment carried out by the inventors, it has been found, in the prior art memory device, that the portions (overlapping portions 210) of the second gate insulating film 110 where the edge of the second gate insulating film 110 overlaps the floating gate 111 are especially susceptible to dielectric breakdown and that the second gate insulating film 110 will become less susceptible to dielectric breakdown if the total length of the overlapping portions 210 is shortened. Since it is desirable that the length L3 of the overlapping portion 112 be made as short as possible, the length L3 is reduced to the minimum dimension attainable by the lithography technique employed in this embodiment, that is, to 1.2 μm (this is also the minimum dimension in terms of design). As described, the floating gate 111 is so patterned as to cross only a portion of one side of the window 109 with the length L3 of the overlapping portion 112 reduced to the minimum dimension in terms of fabrication technique, thereby making the second gate insulating film 110 less susceptible to dielectric breakdown. Since the length L3 of the overlapping portion 112 in this embodiment is about one-fourth of the total length of the overlapping portions 210 in the prior art, the probability of dielectric breakdown of the second gate insulating film 110 of this embodiment is reduced to about one-fourth as compared with the prior art construction.

Figure 2A:
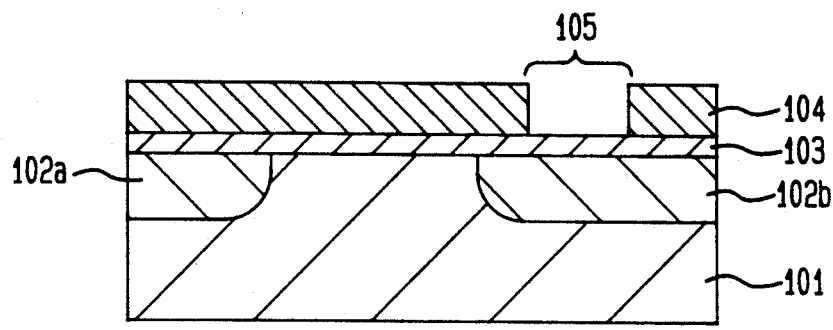
FIGS. 2A to 2K show the non-volatile semiconductor memory device at various processing steps according to one method for the fabrication of the memory device.
Figure 2B:
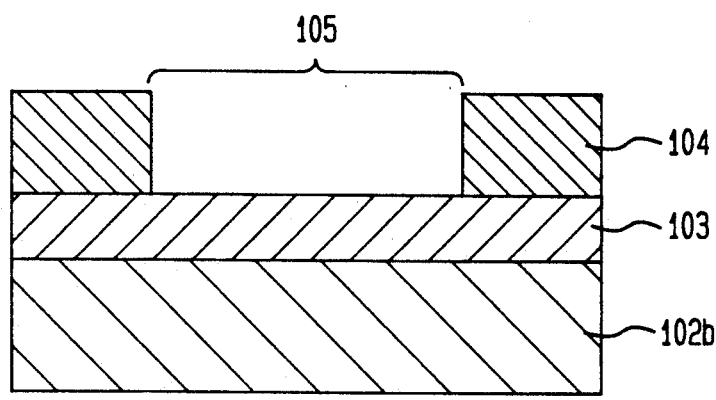
Figure 2C:
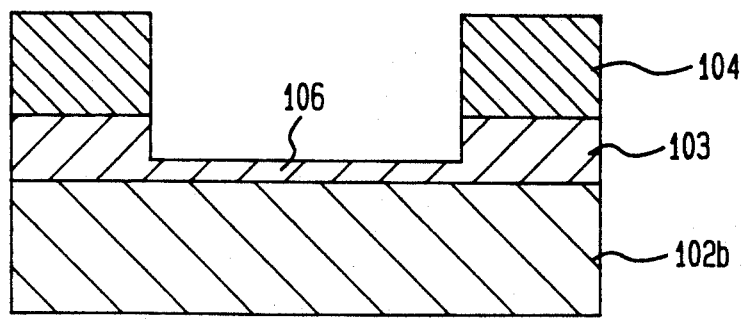
Figure 2D:
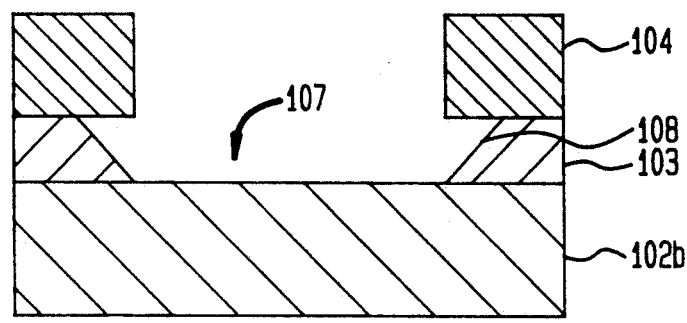
Figure 2E:
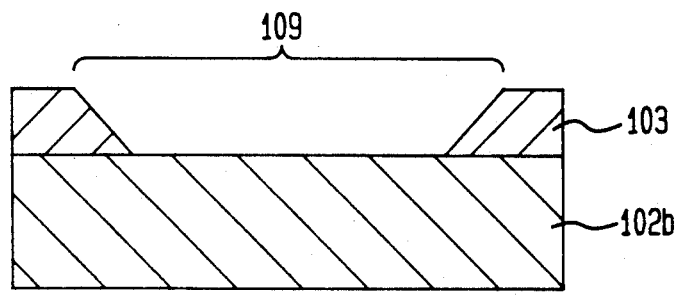
Figure 2F:
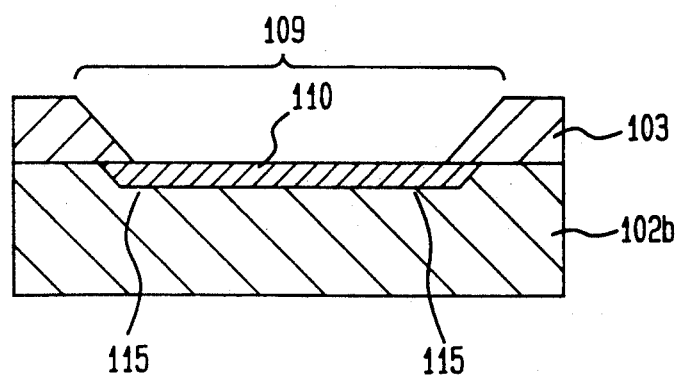
Figure 2G:
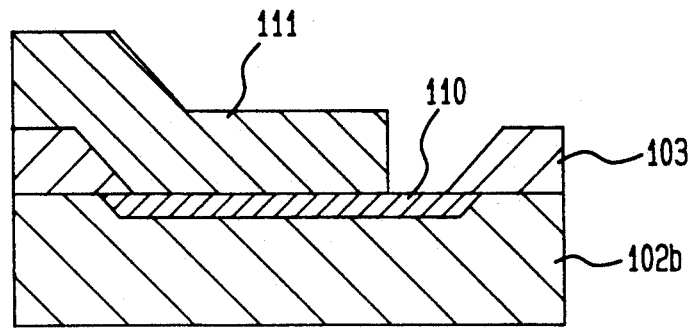
Figure 2H:
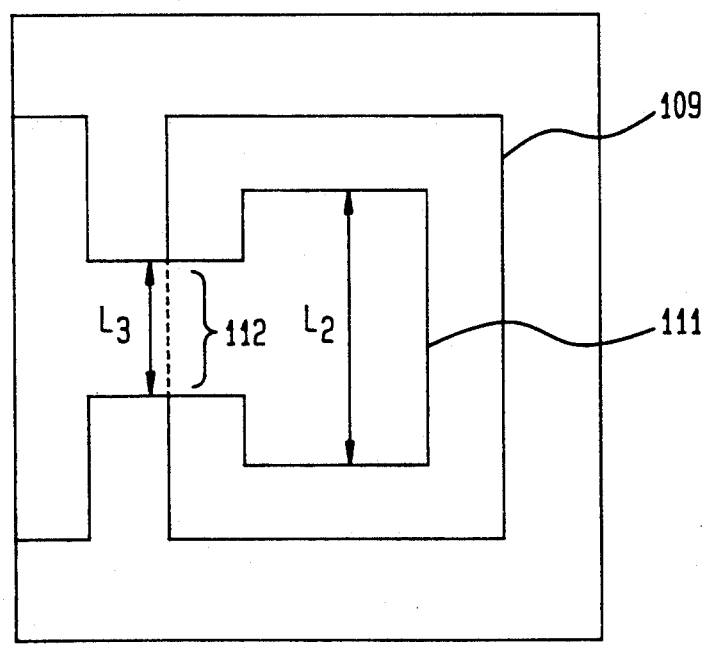

Referring to FIGS. 2A to 2K, we will now describe a method for the fabrication of the non-volatile semiconductor memory device shown in FIGS. 1A and 1B according to the present invention. First, as shown in FIG. 2A, the diffusion layers (layer thickness: 850 nm) which respectively act as the source region 102a and the drain region 102b were formed in the silicon substrate 101. The formation of the diffusion layers was achieved by selectively implanting impurity ions into the silicon substrate 101. In this embodiment, a p-type single-crystalline silicon substrate having a (100) plane as a main surface (resistivity: 10–15 Ωcm) was used as the silicon substrate 101, and phosphorus ions (n-type impurities) were used as the impurity ions. Impurities of an opposite conductivity type to that of the silicon substrate 101 were used as the impurities to form the diffusion layers. The impurity concentration was $1 \times 10^{17}$ to $3 \times 10^{17}$ cm$^{-3}$.

In this embodiment, the source region 102a and the drain region 102b were formed in the silicon substrate 101 prior to the formation of the first gate insulating film 103, but alternatively, the source region 102a and the drain region 102b may be formed in self-aligning fashion with respect to the floating gate 111 after the formation of the floating gate 111, as described hereinafter.

The first gate insulating film 103 (film thickness: 55 nm) was formed on the silicon substrate 101 by oxidizing the main surface of the silicon substrate 101 using a conventional method, after which a photoresist 104 was applied over the first gate insulating film 103. The photoresist 104 has a window region 105 defining the plane pattern of the window 109 (shown in FIG. 2E, not in FIG. 2A) in the first gate insulating film 103. The window region 105 was above the drain region 102b and had a rectangular plane pattern, the size being 1.2 μm × 1.2 μm. The orientation flat of the silicon substrate having a main surface of (100) plane is usually (100) plane. The window region 105 was formed so that each side thereof was parallel to the <100> orientation.

FIG. 2B shows an enlarged cross sectional view of the vicinity of the window region 105 of the non-volatile semiconductor memory device in the above fabrication step. FIGS. 2C to 2G show enlarged cross sectional views of the vicinity of the window region 105 of the non-volatile semiconductor memory device in the following fabrication steps.

Using the photoresist 104 as an etching mask, dry etching was performed to etch the first gate insulating film 103 by 45 nm from the surface thereof, thereby reducing the thickness of the first gate insulating film 103. As a result, a first gate insulating film portion 106 having a reduced thickness (approx. 10 nm thickness) was formed as shown in FIG. 2C. The dry etching was performed with a high degree of anisotropy. Using such a dry etching technique with a high degree of anisotropy, it is possible to form a fine-featured window 109, the size approximately 1.3 μm × 1.3 μm or smaller, in the first gate insulating film 103.

Next, as shown in FIG. 2D, using the photoresist 104 as an etching mask, wet etching was performed to completely remove the first gate insulating film portion 106, thereby exposing a surface region 107 of the silicon substrate 101. Since a hydrofluoric etchant was used for the etching, only the thin first gate insulating film portion 106 was etched away, leaving the surface region 107 of the silicon substrate 101 unetched. Therefore, no recess was formed on the surface region 107, and the surface flatness of the silicon substrate 101 was maintained. In the meantime, since the etching proceeds isotropically, the first gate insulating film 103 was also etched in lateral directions, which resulted in the formation of a taper 108 at each end of the first gate insulating film 103. Thereafter, by removing the photoresist 104, the formation of the window 109 was completed, as shown in FIG. 2E.

Next, as shown in FIG. 2F, the second gate insulating film 110 was formed on the drain region 102b by selectively oxidizing the exposed surface region through the window 109 in the first gate insulating film 103. The second gate insulating film 110 acts as a tunnel oxide film in the non-volatile semiconductor memory device. The desirable thickness of the second gate insulating film 110 is 5 nm to 10 nm. It is desirable that an RTA (Rapid Thermal Annealing) method be used as the oxidation method for forming the thin first gate insulating film 103. Also, in order to enhance the reliability of the second gate insulating film 110, a nitride film may be formed on top of the oxide film, the nitride film and the oxide film together forming the second gate insulating film 110.

Prior to the oxidation step for forming the second gate insulating film 110, a cleaning process using $H_2SO_4$ was carried out. Since $H_2SO_4$ did not etch silicon, no recess was formed on the surface region 107.

Figure 2I:
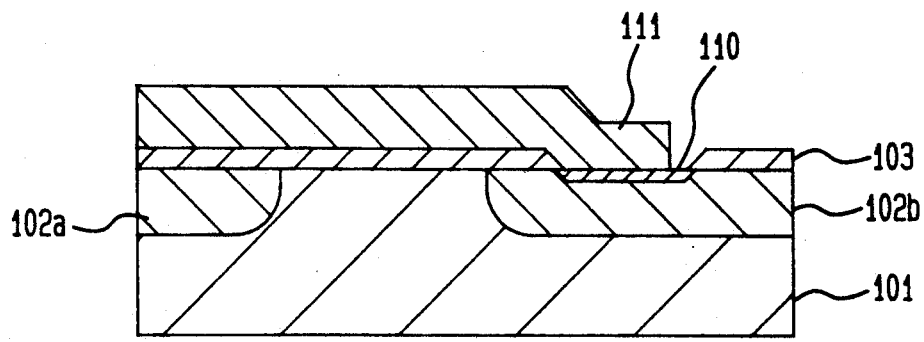

Next, as shown in FIG. 2G, the floating gate 111 (thickness: 400 nm) was formed on the first gate insulating film 103 and the second gate insulating film 110. In order to form the floating gate 111 in a desired shape, a polycrystalline silicon film was first deposited on the first gate insulating film 103 using a CVD method, and then, dry etching was performed to produce a desired pattern in the polycrystalline silicon film. In this method of the embodiment, the etching process for patterning the polycrystalline silicon film was performed while controlling the etching conditions so that the second gate insulating film 110 was not etched. FIG. 2I shows a cross section of the non-volatile semiconductor memory device, in a wider view than FIG. 2G, after the formation of the floating gate 111.

Figure 2J:
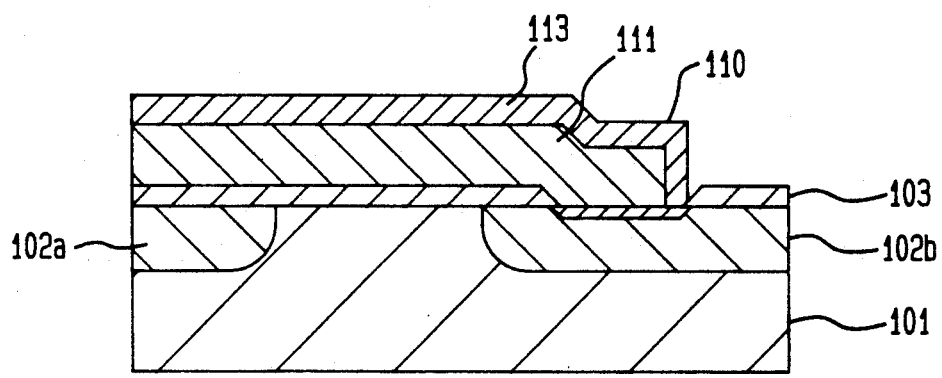
Figure 2K:
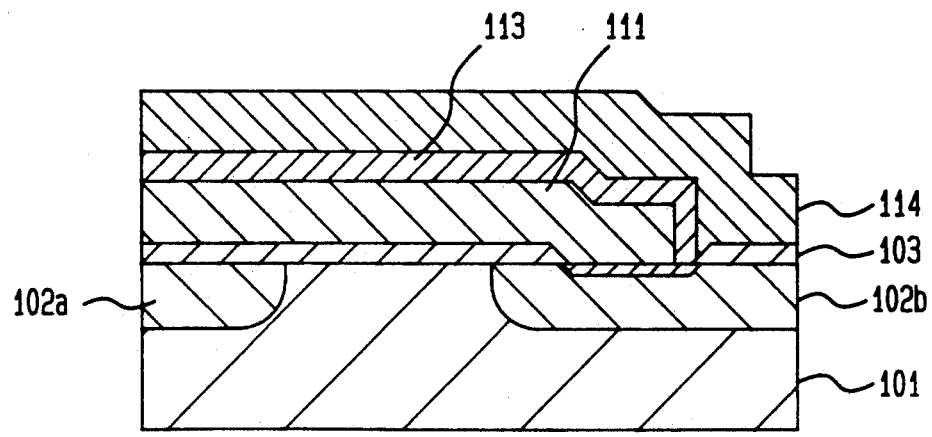

Next, as shown in FIG. 2J, the surface of the floating gate 111 was oxidized to form the third gate insulating film (made of silicon dioxide) 113 covering the floating gate 111. Thereafter, as shown in FIG. 2K, in a similar manner to the formation of the floating gate 111, the control gate (made of polycrystalline silicon) 114 was formed above the floating gate 111 to complete the fabrication of the non-volatile semiconductor memory device.

According to the method of this embodiment, the window 109 was formed by a two-step etching process using dry etching in conjunction with wet etching, in order to avoid the shortcomings of the prior art method in that the silicon substrate 101 was over-etched by dry etching. This embodiment also overcomes the problem of the difficulty in forming a fine-featured window 109 (for example, 1.0 $\mu m \times 1.0$ $\mu m$ or smaller size) when formed by wet etching only. The fabrication method of this embodiment enables fabrication of fine-featured non-volatile semiconductor memory device and is therefore suitable for fabricating a non-volatile semiconductor memory device with a higher packing density.

Prior to the oxidation step for forming the second gate insulating film 110, the cleaning step was performed using $H_2SO_4$ instead of $NH_4OH$, in order to prevent the etching of the surface 107 of the silicon substrate 101. In the cleaning step, a mixture of $H_2SO_4$ and $H_2O_2$ may be used. Thus, according to this embodiment, no recess was formed on the surface 107 of the silicon substrate 101, and the edges of the second gate insulating film 110 were prevented from suffering dielectric breakdown due to the recess, thereby serving to extend the life time of the non-volatile semiconductor memory device as compared with the prior art one. While the non-volatile semiconductor memory device of the prior art has a rewritable number of times of $10^2$, the device of the present embodiment has a rewritable number of times of $10^4$.

Example 2

Referring to FIGS. 3A to 3I, we will now describe another method for the fabrication of the non-volatile semiconductor memory device according to the present invention. According to this method, dielectric breakdown of the second gate insulating film 110 was prevented without the two-step etching process used in the foregoing embodiment to form the window 109 in the first gate insulating film 103.

Figure 3A:
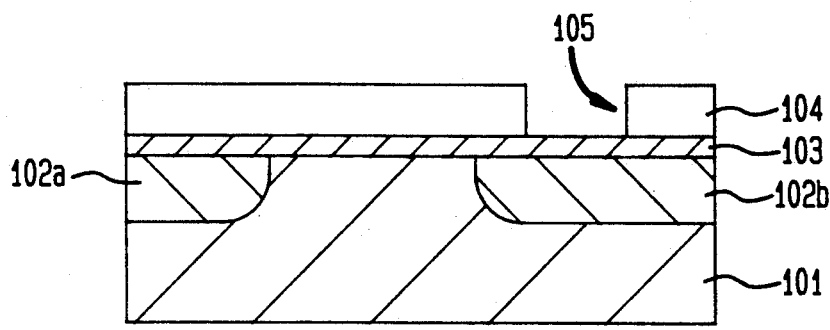
FIGS. 3A to 3I show the non-volatile semiconductor memory device at various processing steps according to another method for the fabrication of the memory device.
Figure 3B:
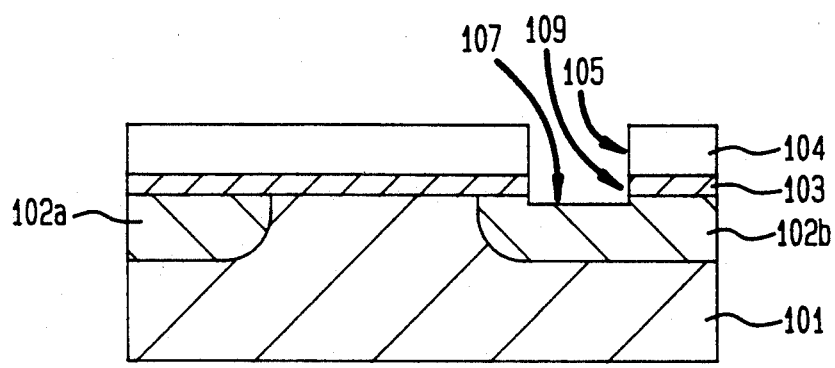
Figure 3C:
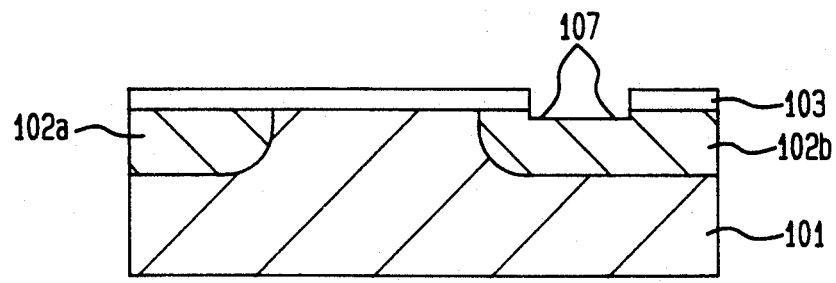

First, as shown in FIG. 3A, diffusion layers (layer thickness: 850 nm) which respectively act as a source region 102a and a drain region 102b were formed in a silicon substrate 101. The formation of the diffusion layers was achieved by selectively implanting impurity ions into the silicon substrate 101. A p-type single-crystalline silicon substrate (resistivity: 10–15 $\Omega cm$) having a (100) plane as a main surface was used as the silicon substrate 101, and phosphorus ions were used as the impurity ions.

In this embodiment also, the source region 102a and the drain region 102b were formed in the silicon substrate 101 prior to the formation of the first gate insulating film 103, but alternatively, the source region 102a and the drain region 102b may be formed in self-aligning fashion with respect to the floating gate 111 after the formation of the floating gate 111.

A first gate insulating film 103 (film thickness: 55 nm) was formed on the silicon substrate 101 by oxidizing the main surface of the silicon substrate 101 using a conventional method, after which a photoresist 104 was applied over the first gate insulating film 103. The photoresist 104 has a window region 105 defining the plane pattern of a window 109 to be opened in the first gate insulating film 103 (shown in FIG. 3B, not in FIG. 3A). The window region 105 was formed above the drain region 102b.

Figure 9A:
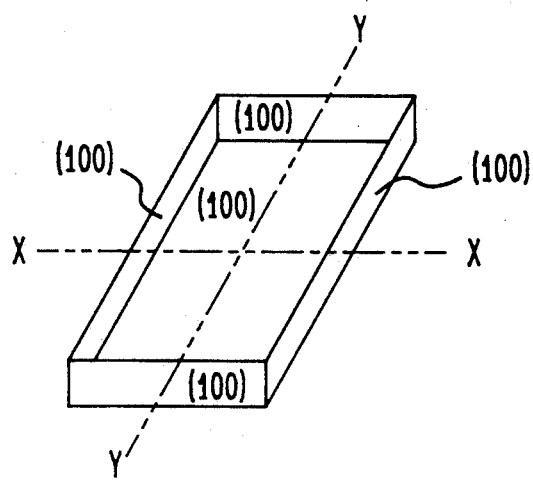
FIGS. 9A to 9C relate to the prior art semiconductor memory device and show a recessed portion formed on a silicon substrate within a window portion and a second gate insulating film (tunnel insulating film) formed on the recessed portion.

The window region 105 has a rectangular plane pattern, the size being 1.2 $\mu m \times 1.2$ $\mu m$. In this embodiment, the photoresist 104 was applied so that each side line of the window 105 was parallel to the <110> orientation. According to the prior art, each side line of the window 105 was parallel to the <100> orientation, as shown in FIG. 9A.

Using the photoresist 104 as an etching mask, dry etching was performed to etch the first gate insulation film 103, to expose a surface region 107 of the silicon substrate 101. As a result of the dry etching, the surface region 107 of the silicon substrate 101 was over-etched and a recess was formed on the surface region 107. After that, the photoresist 104 was removed. When wet etching is used instead of dry etching, formation of the recess resulting from over-etching will not occur. However, when a cleaning step using $NH_4OH$ or other ammoniacal solution is performed after that, a recess is formed on the surface region 107.

Figure 3D:
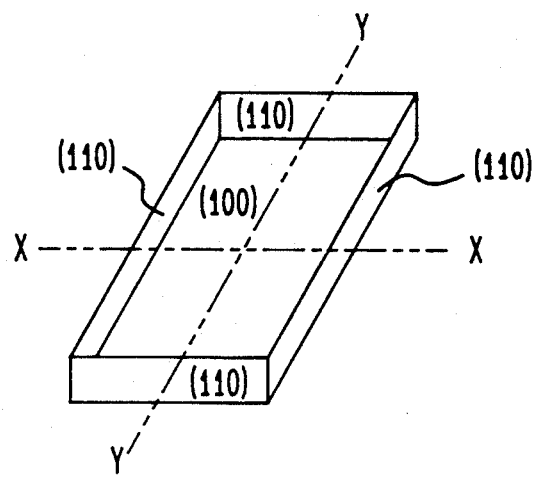
Figure 3E:
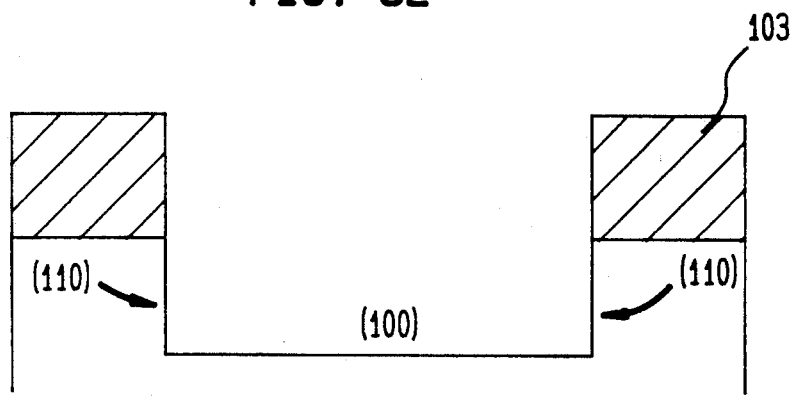
Figure 9B:
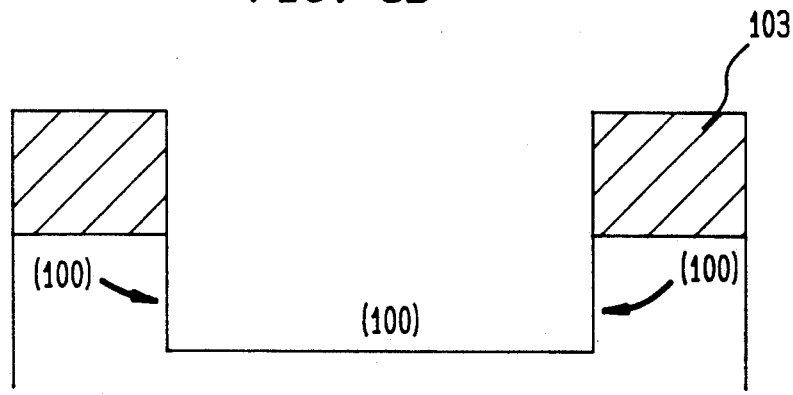

FIG. 3D is a perspective view showing the shape of the surface region 107. FIG. 3E shows a cross section taken along line X—X or Y—Y in FIG. 3D. As described above, the window 109 of this embodiment has a rectangular plane pattern formed by four sides parallel to the <110> orientation. Therefore, when the exposed surface of the silicon substrate 101 (drain region 102b) was etched through the window 109, a recess having four side walls of (110) planes was formed on the surface region 107, as shown in FIGS. 3D and 3E. With the prior art method, the side walls of the recess have (100) planes as shown in FIGS. 9A and 9B.

Figure 3F:
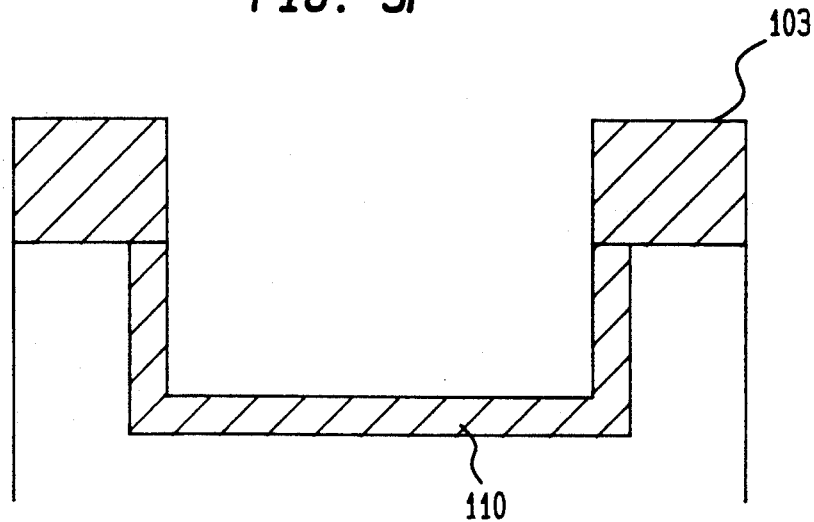
Figure 9C:
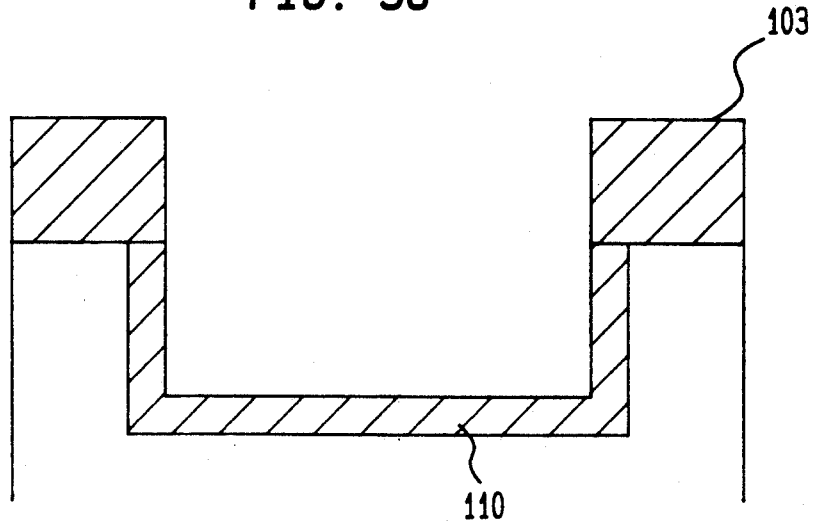

Next, when the surface region 107 exposed through the window 109 of the first gate insulating film 103 was selectively oxidized, a second gate insulating film 110 was formed, as shown in FIG. 3F. The second gate insulating film 110 was formed not only on the bottom but also on the side walls of the recess. The second gate insulating film 110 has a greater thickness at the side walls than at the bottom of the recessed portion. Thus, according to the method of this embodiment, since the thickness of the second gate insulating film 110 formed on the side walls of the recess can be made sufficiently thick, it was possible to prevent the edge portions from being reduced in thickness and from suffering dielectric breakdown in a short time. On the other hand, according to the prior art method, since the second gate insulating film 110 formed on the recess has the same thickness at both the side walls and bottom of the recessed portion (FIG. 9C), the edge portions are susceptible to dielectric breakdown.

Figure 3G:
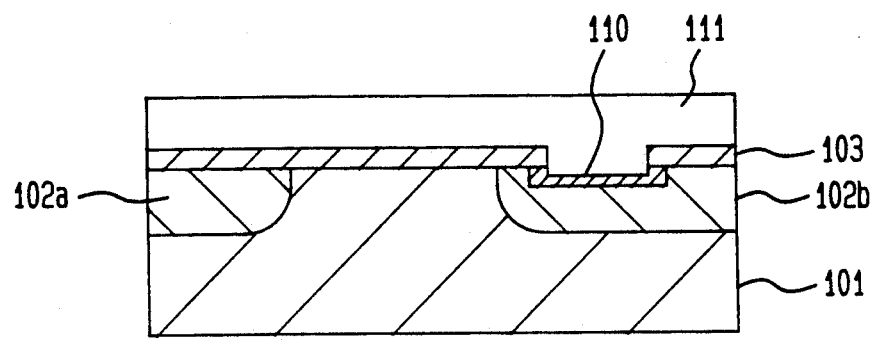
Figure 3H:
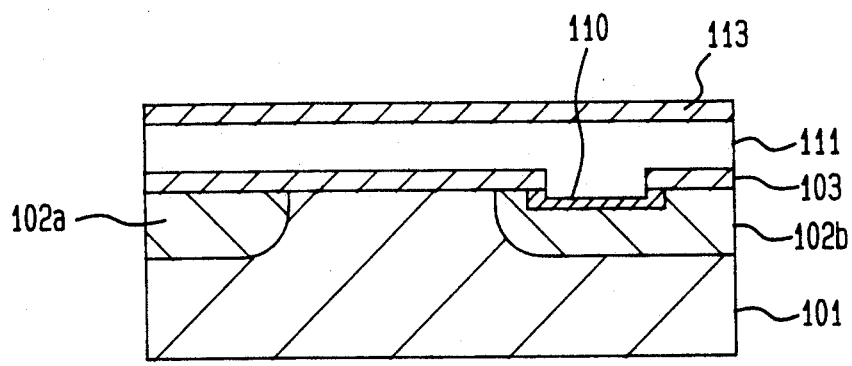
Figure 3I:
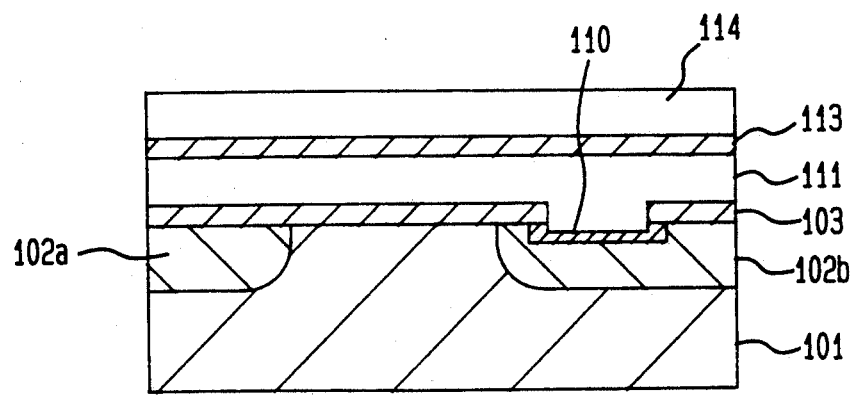

Subsequently to the above step, a floating gate 111 was formed on the first gate insulating film 103 and the second gate insulating film 110, as shown in FIG. 3G, in the same manner as for the foregoing embodiment. Then, as shown in FIG. 3H, the surface of the floating gate 111 was oxidized to form a third gate insulating film 113 covering the floating gate 111, after which a control gate 114 was formed above the floating gate 111, as shown in FIG. 3I, thus completing the fabrication of the non-volatile semiconductor memory device.

According to this embodiment, although the recess was formed on the surface region 107 of the silicon substrate 101 because of the over-etching or other phenomenon occurring during the processing step of opening the window 109 in the first gate insulating film 103, since a relatively thick oxide film grows on the recess, dielectric breakdown at the edge portions of the second gate insulating film 110 was prevented, thus serving to extend the life time of the memory device.

In this embodiment, the substrate with an orientation flat of (100) plane was used as the silicon substrate 101, but alternatively, a substrate with an orientation flat of (110) plane may be used. The plane layout of a semiconductor integrated circuit device was usually formed by lines parallel or normal to the orientation flat of the silicon substrate. Therefore, when an ordinary substrate with an orientation flat of (100) plane is used, the <110> orientation is oblique to the reference line. However, when a substrate with an orientation flat of (110) plane is used, the <110> orientation becomes vertical or parallel to the reference line, which matches the conventional plane layout.

In this embodiment, the silicon substrate 101 has a (100) plane as its main surface, and the shape of the window 109 was controlled so that the side walls of the recess formed by etching on the silicon substrate 101 had (110) planes, but it will be appreciated that the same effects can be obtained even when the side walls of the recess are (111) if the main surface of the silicon substrate is (100) or (110). This is because a silicon substrate generally has a characteristic that the (111) plane is the most susceptible to oxidation.

Example 3

Referring to FIGS. 4A to 4H, we will now describe a further method for the fabrication of the non-volatile semiconductor memory device according to the present invention. According to the method of this embodiment, the source region 102a and the drain region 102b were formed after forming the floating gate 111.

Figure 4A:
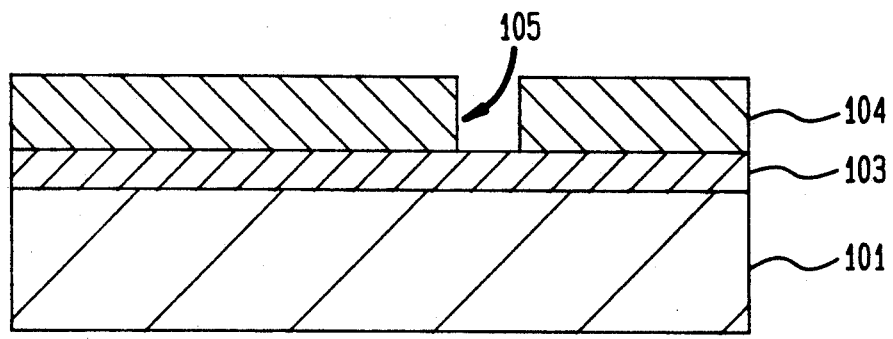
FIGS. 4A to 4H show the non-volatile semiconductor memory device at various processing steps according to a further method for the fabrication of the memory device.

First, as shown in FIG. 4A, a first gate insulating film 103 (50 nm thickness) was formed on a silicon substrate 101, and then, a photoresist 104 was applied over the first gate insulating film 103. The photoresist 104 had a window region 105 defining the pattern of a window 109 to be opened in the first gate insulating film 103.

Figure 4B:
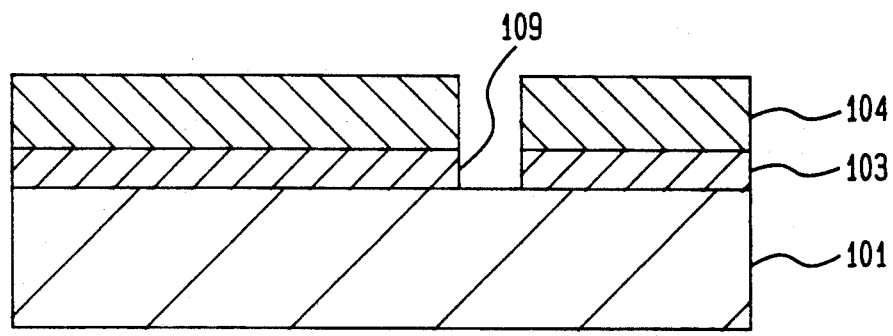

Next, as shown in FIG. 4B, using the photoresist 104 as an etching mask, wet etching was performed to etch the first gate insulating film 103 from the surface thereof, thereby opening the window 109 in the first gate insulating film 103. The size of the thus formed window 109 was 1.4 $\mu m \times 1.4$ $\mu m$. If the window 109 is to be formed in a smaller size, the two-step etching method described in the first embodiment may be used instead of wet etching. Since the first gate insulating film 103 of this embodiment was a silicon oxide film formed by oxidizing the surface of the silicon substrate 101, a hydrofluoric etchant was used for the wet etching.

Figure 4C:
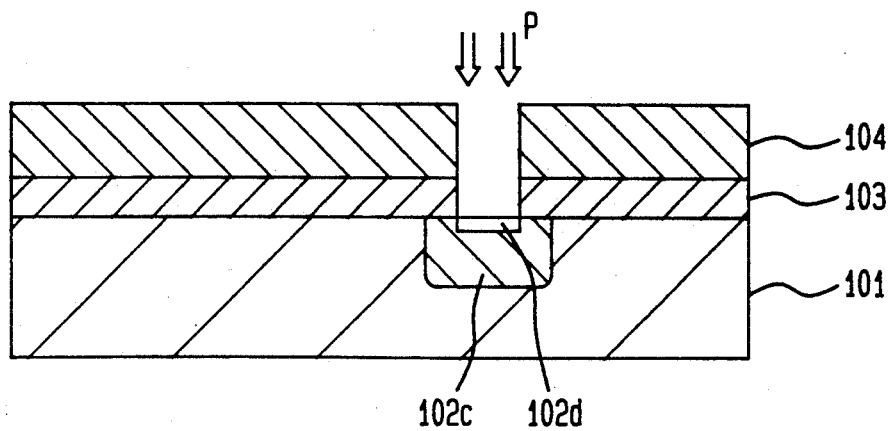
Figure 4D:
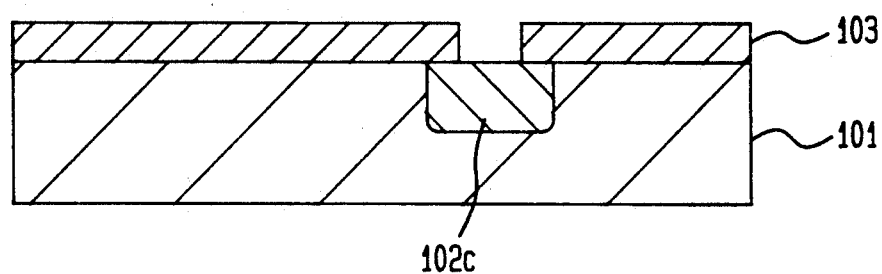

Next, as shown in FIG. 4C, using the photoresist 104 and the first gate insulating film 103 as an implantation mask, phosphorus ions were implanted into the exposed surface area of the silicon substrate 101 to form a phosphorus ion implanted layer 102c. The ion implanted layer 102c will eventually form a portion of the drain region 102b. Implantation of the phosphorus ions was performed under the conditions of dose $1 \times 10^{14}$ cm$^{-2}$ and acceleration energy 40 keV. As a result of the ion implantation, a damage layer 102d was formed in the portion of the silicon substrate 101 where the phosphorus ions have been implanted. In this embodiment, annealing was performed after removal of the photoresist 104, to recover the damage layer 102d to a single-crystalline layer with less crystal defects (see FIG. 4D). The annealing was performed for 30 minutes in N$_2$ atmosphere at a temperature of 900° C. The desirable annealing temperature range is 800° to 950° C.

Phosphorus ions may be implanted into the silicon substrate 101 in such a way as to penetrate the first gate insulating film 103 before performing the step of opening the window 109. However, with this method, oxygen atoms in the first gate insulating film 103 are knocked on by the phosphorus ions and are implanted into the silicon substrate 101, resulting in the formation of an amorphous silicon oxide layer on the surface of the silicon substrate 101. The amorphous silicon oxide layer composed of the knocked-on oxygen atoms is etched away together with the first gate insulating film 103 by the etching process for opening the window 109, resulting in the formation of a recess on the surface of the silicon substrate 101. However, with the method of this embodiment, since implantation of impurity ions was performed after opening the window 109, an amorphous silicon oxide as mentioned above were not formed, and therefore, no recess was formed on the surface of the silicon substrate 101. Since no recess was formed on the surface, it was possible to form a second gate insulation film less susceptible to dielectric breakdown.

The prior art method, in which phosphorus ions are implanted in such a way as to penetrate the first gate insulating film 103 (50 nm thickness), requires an acceleration energy of about 100 keV to implant the phosphorus ions to a prescribed depth (e.g., 100 nm) below the surface of the silicon substrate 101. On the other hand, according to the method of this embodiment, an acceleration energy of about 40 keV will serve the purpose. Reduction in the acceleration energy has the advantage of reducing the implantation damage caused to the silicon substrate 101.

Figure 4E:
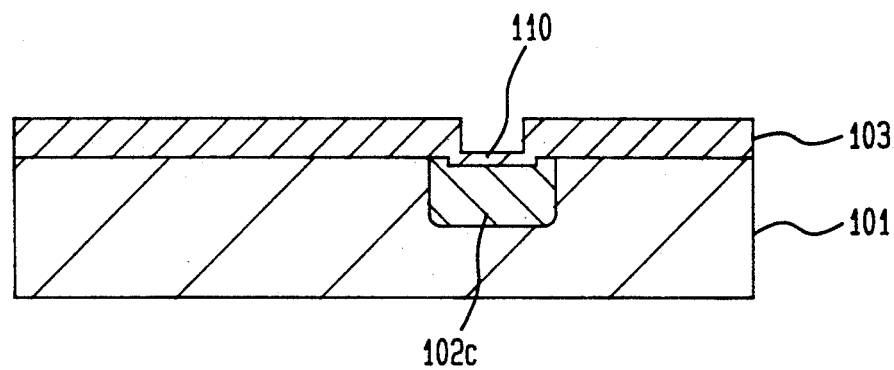

Next, as shown in FIG. 4E, the exposed surface area of the silicon substrate 101 was selectively oxidized to form thereon a second gate insulating film 110 (10 nm thickness) that acts as a tunnel insulating film. FIG. 4H shows an enlarged cross section of the second gate insulating film 110 at this processing step. Since no recess was formed on the surface of the silicon substrate 101, the second gate insulating film 110 was formed with no reduction in thickness at its edge portions.

Figure 4F:
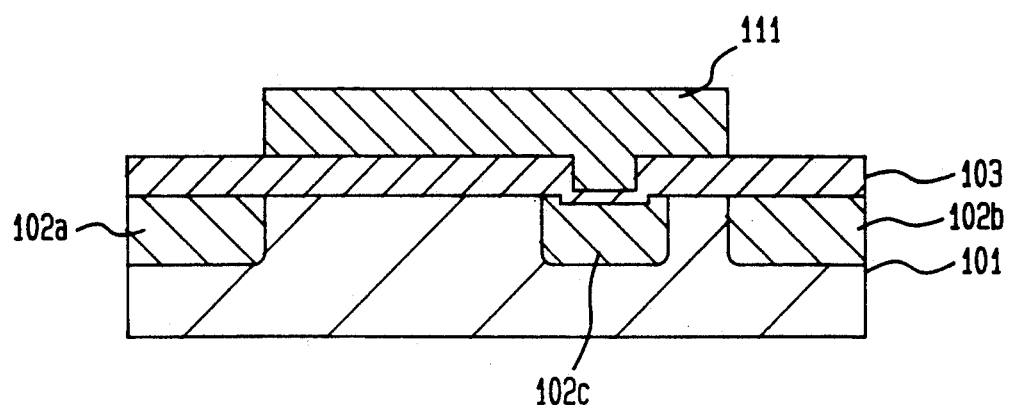
Figure 4G:
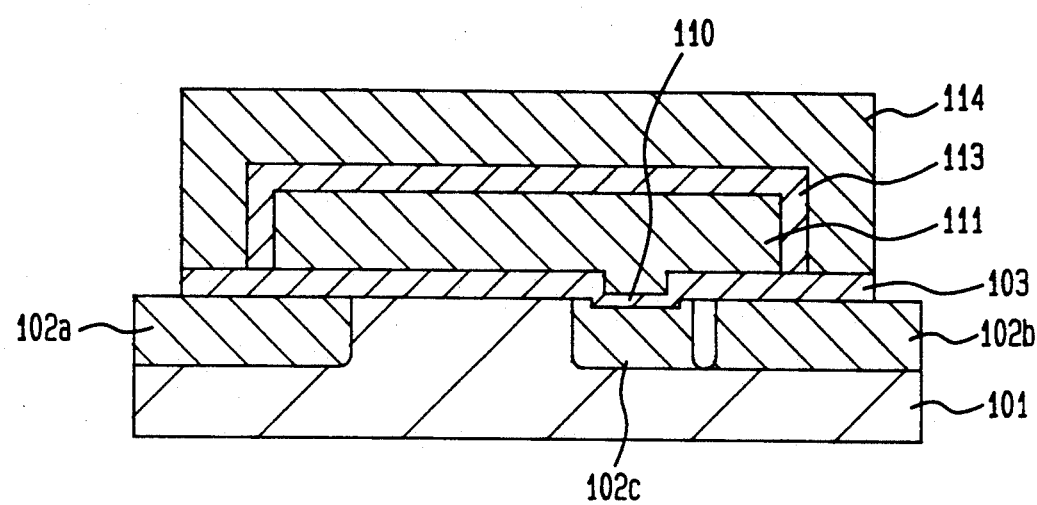
Figure 4H:
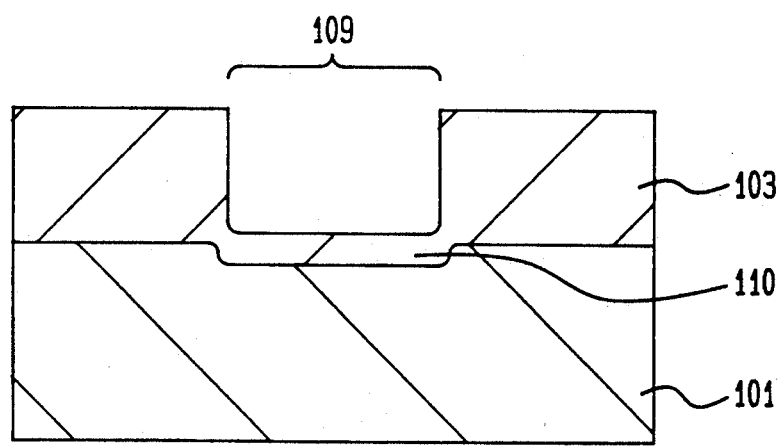

As shown in FIG. 4F, in order to form a source region 102a and a drain region 102b in self-aligning fashion with respect to a floating gate 111 after forming the floating gate 111, phosphorus ions were implanted using the floating gate 111 as an implantation mask. Thereafter, annealing was performed to activate the implanted impurity ions (P ions), to complete the formation of the source region 102a and drain region 102b. As a result of the annealing, the phosphorus ion implanted layer 102c and the drain region 102b were formed overlapping each other. Finally, a third gate insulating film 113 was formed on the floating gate 111, which was followed by the formation of a control gate 114 on the third gate insulating film 113, thereby completing the fabrication of the non-volatile semiconductor memory device shown in FIG. 4G.

Thus, according to the method of this embodiment, since an amorphous silicon oxide film was not formed on the surface of the silicon substrate 101, no recess was formed on the surface of the silicon substrate 101. This prevented the second gate insulating film 110 from suffering dielectric breakdown resulting from a reduced thickness at the recessed portion, and thereby extended the life time of the memory device as compared with the prior art memory device.

Also, since the damage layer 102d formed as a result of implantation of the phosphorus ions was restored by annealing before forming the second gate insulating film 110, no deterioration was caused to the film quality of the second gate insulating film 110 which was formed thereafter. In the above embodiment, the annealing step for restoring the silicon substrate 101 from the damage caused by the phosphorus ion implantation was performed separately from the subsequent oxidation step for forming the second gate insulating film 110, but alternatively, the annealing and oxidation steps may be performed continuously in the same equipment. Also, other oxidation steps (sacrificing oxidation steps) may be performed prior to the oxidation step for forming the second gate insulating film 110. In that case, since the oxide film formed by sacrificing oxidation may contain numerous defects, the oxide film should be removed before performing the oxidation step for forming the second gate insulating film 110. The second gate insulating film 110 formed thereafter thus contained far less defects and provided an excellent property as a tunnel insulating film. However, if the oxide film formed by sacrificing oxidation is too thick, a deep recess will be formed on the surface of the silicon substrate 101 after removal of the oxide film. It is therefore desirable that the thickness be controlled to approximately 10 nm or less.

Example 4

Figure 5A:
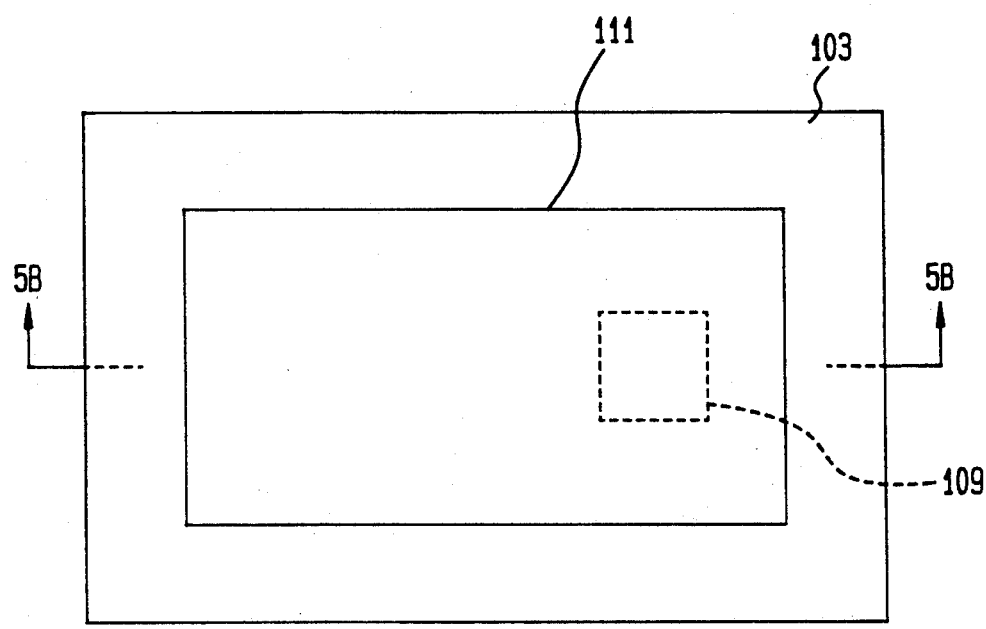
FIG. 5A is a plan view of another non-volatile semiconductor memory device according to the present invention.
Figure 5B:
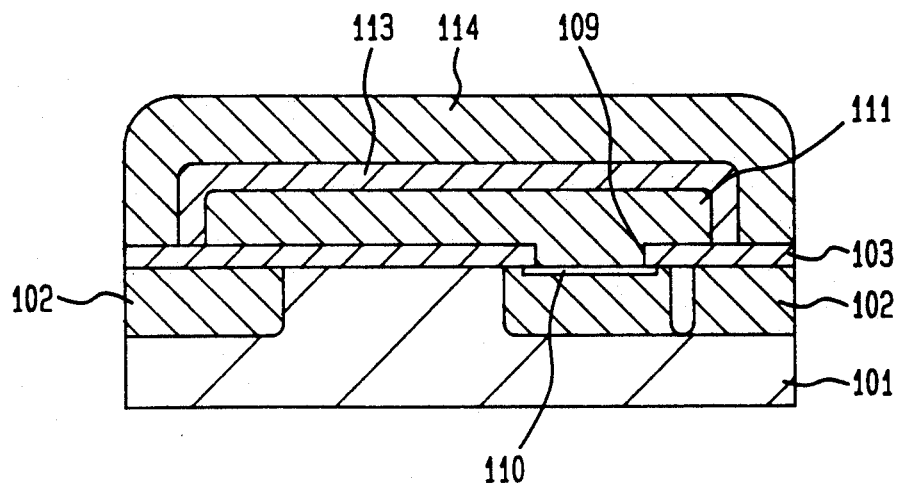
FIG. 5B is a cross sectional view taken along line B—B in FIG. 5A.

FIG. 5A is a diagram showing the plane structure of another non-volatile semiconductor memory device according to the present invention. FIG. 5B is a cross sectional view taken along line B—B in FIG. 5A.

As shown in FIG. 5B, the non-volatile semiconductor memory device of this embodiment comprises: a silicon substrate 101 having a source region 102a and a drain region 102b each formed from a diffusion layer; a first gate insulating film 103 formed on the silicon substrate 101 and having a window 109; a second gate insulating film 110 formed on the silicon substrate 101 within the window 109; a floating gate 111 formed on the first gate insulating film 103 and covering the entire second gate insulating film 110; a third gate insulating film 113 formed on the floating gate 111; and a control gate 114 formed on the third gate insulating film 113. The second gate insulating film 110 formed on the drain region 102b within the window 109 acts as a tunnel insulating film.

As shown in FIG. 5A, one of the main feature of the non-volatile semiconductor memory device of this embodiment is that the floating gate 11 is formed completely covering the second gate insulating film 110. In such a construction, when the oxidation step is performed for forming the third gate insulating film 113 after forming the floating gate 111, no oxidation occurs to any portion of the second gate insulating film 110 during the oxidation step.

In the non-volatile semiconductor memory device shown in FIG. 1A as well as in the prior art one shown in FIG. 8E, since the floating gate 111 covers only a portion of the second gate insulating film 110, the portion of the second gate insulating film 110 not covered by the floating gate 111 was oxidized and expands as a result of the oxidation step for forming the third gate insulating film 113. For example, when oxidation was performed to form a third gate insulating film 113 of 50 nm thickness, the exposed portion of the second gate insulating film 110 grows to a thickness of about 30 nm. When the thickness of the oxidized portion was increased, the stress resulting therefrom occurs within the second gate insulating film 110 and the silicon substrate 101 covered by the second gate insulating film 110. In particular, dislocations were generated in the silicon substrate 101 at the regions where the edges of the second gate insulating film 110 and the floating gate 111 overlap each other. The dislocations accelerate the dielectric breakdown of the second gate insulating film 110. As described previously, in the non-volatile semiconductor memory device shown in FIGS. 1A and 1B, since the length L3 of overlapping portion 112 is reduced as compared with that of the overlapping portion in the prior art, the probability of dielectric breakdown of the second gate insulating film 110 is greatly reduced. On the other hand, in the non-volatile semiconductor memory device of this embodiment, since the possibility of such a problem was completely eliminated, the problem associated with the stress resulting from partial oxidation of the second gate insulating film 110 was overcome, and therefore, the life time of the memory device fabricated according to this embodiment was further extended.

Example 5

Figure 6A:
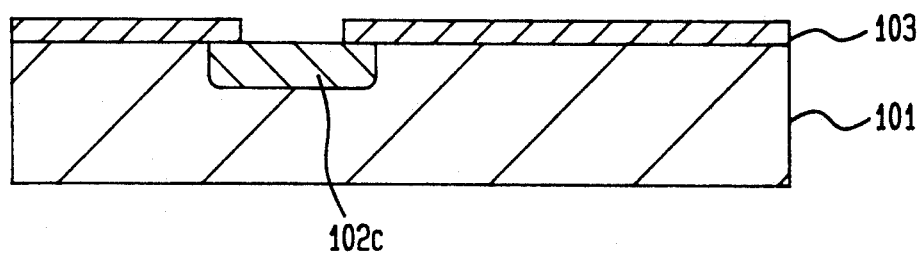
FIGS. 6A to 6E are cross sectional views of still another non-volatile semiconductor memory device in various processing steps according to a method for the fabrication of the memory device.
Figure 6B:
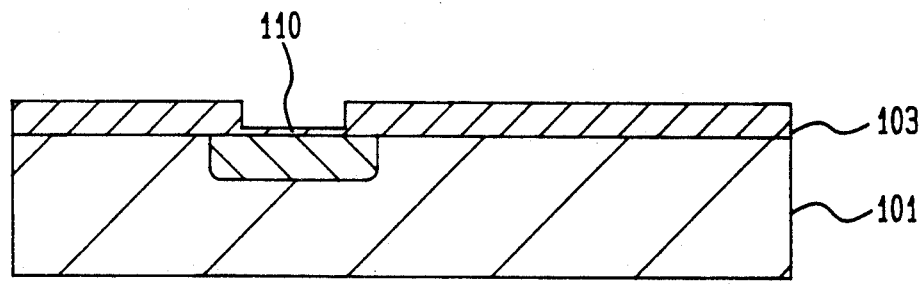
Figure 6C:
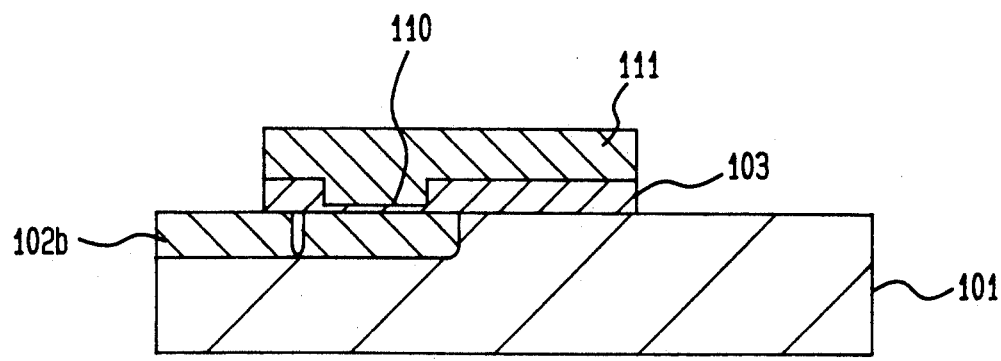
Figure 6D:
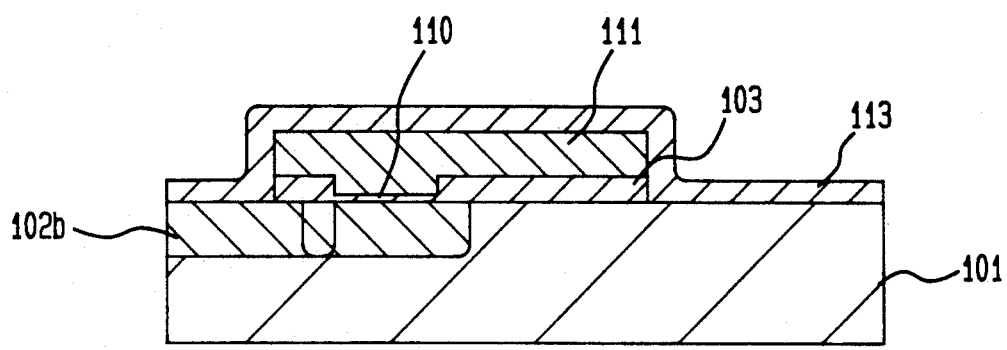
Figure 6E:
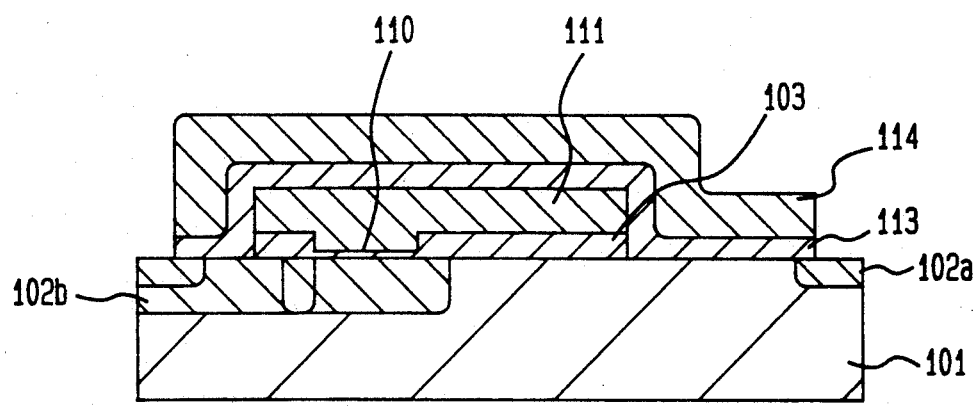

FIG. 6E shows a cross sectional structure of still another non-volatile semiconductor memory device according to the present invention. The non-volatile semiconductor memory device of this embodiment comprises: a silicon substrate 101 having a source region 102a and a drain region 102b each formed from a diffusion layer; a first gate insulating film 103 formed on the silicon substrate 101 and having a window 109; a second gate insulating film 110 (10 nm thickness) formed on the silicon substrate 101 within the window 109; a floating gate 111 formed on the first gate insulating film 103 and covering a portion of the second gate insulating film 110; a third gate insulating film 113 (50 nm thickness) formed on the floating gate 111; and a control gate 114 formed on the third gate insulating film 113. The second gate insulating film 110 formed on the drain region 102b within the window 109 acts as a tunnel insulating film. The source region 102a is formed by an arsenic (As) diffusion layer (thickness: 200 nm), while the drain region 102b is formed by a phosphorus (P) diffusion layer (thickness: 850 nm) and an arsenic (As) diffusion layer (thickness: 200 nm) formed on the surface of the phosphorus diffusion layer.

The non-volatile semiconductor memory device of this embodiment has a portion above the channel region between the source region 102a and the drain region 102b where the floating gate 111 was not formed. The control gate 114 was formed directly above that portion with the third gate insulating film 113 interposed therebetween. In other words, the source region 102a and the floating gate 111 do not overlap each other, and in the region between them, there was formed a MOS structure consisting of the control gate 114, the third gate insulating film 113, and the silicon substrate 101. The inversion threshold voltage of this MOS structure remains substantially constant, not being affected by the presence or absence of carriers injected into the floating gate 111. With the MOS structure thus inserted in serial between the source region 102a and the drain region 102b, the threshold voltage of the non-volatile semiconductor memory device does not drop below the threshold voltage of the MOS structure. In this embodiment, the minimum threshold voltage was set at 0.5 V.

Figure 7:
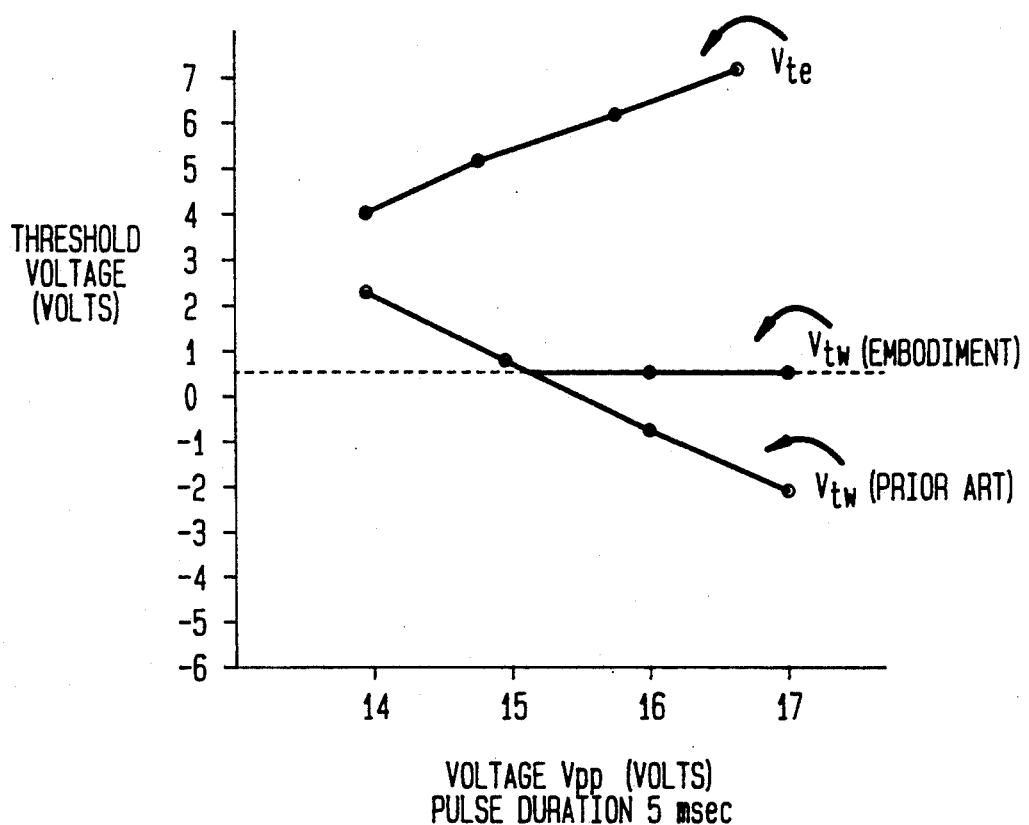
FIG. 7 is a graph showing the relationship of the absolute value Vpp of the voltage applied between the control gate and the drain region with respect to the inversion threshold voltage for the non-volatile semiconductor memory device shown in FIG. 6E.

FIG. 7 shows the relationship of the absolute value Vpp of the pulse voltage (hereinafter referred to as "writing or erasure voltage") applied between the control gate 114 and the drain region 102b, with respect to the threshold voltage of the non-volatile semiconductor memory device. The pulse duration is set at 5 millisecond. In FIG. 7, Vte indicates the threshold voltage with the floating gate 111 injected with carriers (for erasure). When carriers are injected into the floating gate 111, the threshold voltage increases. The vte value is the same for both the non-volatile semiconductor memory device and the prior art memory device. The threshold voltage Vte increases with the increase of the absolute value of erasure voltage Vpp applied between the control gate 114 and the drain region 102b to inject carriers into the floating gate 111. Vtw indicates the threshold voltage with the floating gate 111 not injected with carries (for writing). When carriers are discharged from the floating gate 111, the threshold voltage lowers.

When the writing voltage Vpp applied between the control gate 114 and the drain region 102b to discharge carriers from the floating gate 111 is increased, the threshold voltage Vtw of the prior art non-volatile semiconductor memory device drops below 0.5 V, but in the case of the non-volatile semiconductor memory device of this embodiment, the threshold voltage Vtw will not drop below 0.5 V.

As the absolute value of the voltage Vpp is increased, the difference (Vdif, window value) between the threshold voltage Vte for erasure and the threshold voltage Vtw for writing widens. In terms of the operation of the non-volatile semiconductor memory device, a larger window value Vdif is desirable since it makes it easier to read information from the device. However, if the absolute value of the writing or erasure voltage Vpp is raised in order to increase the window value Vdif, the electric fields formed in the second gate insulating film 110 (tunnel insulating film) will become stronger, which will accelerate the deterioration of the second gate insulating film 110 and therefore reduce the rewritable number of times of the non-volatile semiconductor memory device. From the viewpoint of extending the life time of the memory device, the magnitude of the writing or erasure voltage Vpp should preferably be made as small as possible. In order to obtain the window value Vdif that is determined by the circuit design requirements, it is necessary to apply a sufficiently larger voltage to the control gate 114 than the minimum voltage Vpp required to obtain the window value Vdif, considering the deviation in the process parameter of the fabrication process.

In the non-volatile semiconductor memory device of this embodiment, since the minimum threshold voltage is fixed, the magnitude of the variation in the window value Vdif is reduced to approximately one-half that of the variation in the case of the prior art non-volatile semiconductor memory device. This prevents the window value Vdif from varying greatly from memory device to memory device or depending on the fabrication process, thereby assuring production of non-volatile semiconductor memory device of uniform characteristics. Also, since the voltage Vpp applied between the control gate 114 and the drain region 102b requires a less margin than required by the prior art, the writing/erasure voltage Vpp can be reduced, thereby serving to extend the life time of the memory device.

Referring to FIGS. 6A to 6E, we will now describe a method for the fabrication of the non-volatile semiconductor memory device of this embodiment. First, as shown in FIG. 6A, a first gate insulating film 103 (50 nm thickness) is formed on a silicon substrate 101, and then, a window 109 is opened in the first gate insulating film 103. The size of the window is 1.4 $\mu$m × 1.4 $\mu$m. If the window 109 is to be formed in a smaller size, the two-step etching method described in the first embodiment may be used instead of wet etching. Since the first gate insulating film 103 of this embodiment was a silicon oxide film formed by oxidizing the surface of the silicon substrate 101, a hydrofluoric etchant was used for the wet etching.

Next, using a photoresist (not shown) and the first gate insulating film 103 as an implantation mask, phosphorus ions were implanted into the exposed surface area of the silicon substrate 101 to form a phosphorus ion implanted layer 102c. The phosphorus ion implanted layer 102c will eventually form a portion of the drain region 102b. Implantation of the phosphorus ions was performed under the conditions of dose $7 \times 10^{13}$ cm$^{-2}$ and acceleration energy 100 keV.

Next, as shown in FIG. 6B, the exposed surface portion of the silicon substrate 101 was selectively oxidized to form thereon a second gate insulating film 110 (10 nm thickness) which acts as a tunnel insulating film. After that, a floating gate 111 was formed, as shown in FIG. 6C.

Next, using the photoresist (not shown) and the floating gate 111 as an implantation mask, phosphorus ions were implanted to form only a drain region 102b in self-aligning fashion with respect to the floating gate 111.

As shown in FIG. 6D, a third gate insulating film 113 was formed on the floating gate 111 and the silicon substrate 101, after which a control gate 114 was formed on the third gate insulating film 113. After that, using the control gate 114 as a mask, arsenic ions were implanted into the silicon substrate 101 to form an arsenic diffusion layer in self-aligning fashion with respect to the control gate 114. Ion implantation was performed under the conditions of dose $4 \times 10^{15}$ cm$^{-2}$ and acceleration energy 40 keV. Thereafter, annealing was performed to activate the implanted impurity ions to complete the formation of the source region 102a and drain region 102b. Thus, the fabrication of the non-volatile semiconductor memory device shown in FIG. 6E was completed.

In any of the above embodiments, thermal oxide films were used as the first, second, and third gate insulating films, but any or all of the gate insulating films may be replaced by insulating films made of other materials (for example, SiON).

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A non-volatile semiconductor memory device comprising:
   a semiconductor substrate having a source region and a drain region each formed by a diffusion layer;
   a first gate insulating film formed on said semiconductor substrate, said first gate insulating film having a window;
   a second gate insulating film formed on said semiconductor substrate within said window;
   a floating gate formed on said first gate insulating film, said floating gate covering a portion of said second gate insulating film;
   a third gate insulating film formed on said floating gate; and
   a control gate formed on said third gate insulating film,
   wherein said floating gate has a first portion positioned on said first gate insulating film, a second portion positioned on said second gate insulating film, and spaced at a distance from said first portion, the direction perpendicular to a line therebetween being referred to as the channel width direction, and a third portion interconnecting said first and second portion, said second portion being positioned within said window, the length of said third portion along the channel width direction being shorter than that of said second portion.

2. A non-volatile semiconductor memory device according to claim 1, wherein:
   said source region is formed outside of the region where said floating gate is formed; and
   a portion of said control gate covers a portion of the surface of said semiconductor substrate with said third gate insulating film interposed therebetween at a region between said floating gate and said source region.

3. A non-volatile semiconductor memory device comprising:
   a semiconductor substrate having a source region and a drain region each formed by a diffusion layer;
   a first gate insulating film formed on said semiconductor substrate, said first gate insulating film having a window;
   a second gate insulating film formed on said semiconductor substrate within said window;
   a floating gate formed on said first gate insulating film, said floating gate covering fully said second gate insulating film; and
   a third gate insulating film formed on said floating gate; and
   a control gate formed on said third gate insulating film,
   wherein
   said source region is formed outside of the region where said floating gate is formed;
   said second gate insulating film is formed on said drain region; and
   a portion of said control gate covers a portion of the surface of said semiconductor substrate with said third gate insulating film interposed therebetween at a region between said floating gate and said source region.

4. A non-volatile semiconductor memory device comprising:
   a semiconductor substrate having a source region and a drain region each formed by a diffusion layer;
   a first gate insulating film formed on said semiconductor substrate, said first gate insulating film having a window;
   a second gate insulating film formed on said semiconductor substrate within said window;
   a floating gate formed on said first gate insulating film, said floating gate covering a portion of said second gate insulating film;
   a third gate insulating film formed on said floating gate; and
   a control gate formed on said third gate insulating film,
   wherein said source region is formed outside of the region where said floating gate is formed, said second gate insulating film is formed on said drain region, and a portion of said control gate covers a portion of the surface of said semiconductor substrate with said third gate insulating film interposed therebetween at a region between said floating gate and said source region.

* * * * *